US008829616B2

(12) United States Patent
Chou et al.

(10) Patent No.: US 8,829,616 B2
(45) Date of Patent: Sep. 9, 2014

(54) METHOD AND STRUCTURE FOR BODY CONTACTED FET WITH REDUCED BODY RESISTANCE AND SOURCE TO DRAIN CONTACT LEAKAGE

(71) Applicant: International Business Machines Corporation, Armonk, NY (US)

(72) Inventors: Anthony I-Chih Chou, Beacon, NY (US); Murshed M. Chowdhury, Newburgh, NY (US); Arvind Kumar, Beacon, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 13/660,206

(22) Filed: Oct. 25, 2012

(65) Prior Publication Data

US 2014/0117409 A1    May 1, 2014

(51) Int. Cl.
*H01L 27/12*     (2006.01)
*H01L 21/00*     (2006.01)
*H01L 21/8238*   (2006.01)

(52) U.S. Cl.
USPC ........... 257/347; 438/149; 438/217; 438/218; 438/289

(58) Field of Classification Search
USPC .................. 438/149, 217, 218, 289; 257/347
See application file for complete search history.

(56) References Cited

U.S. PATENT DOCUMENTS

| | | | |
|---|---|---|---|
| 5,559,368 A | 9/1996 | Hu et al. | |
| 5,670,388 A | 9/1997 | Machesney et al. | |
| 6,620,656 B2 * | 9/2003 | Min et al. | 438/149 |
| 6,642,579 B2 * | 11/2003 | Fung | 257/347 |
| 6,724,047 B2 * | 4/2004 | Unnikrishnan | 257/347 |
| 7,820,530 B2 * | 10/2010 | Min et al. | 438/479 |
| 7,910,993 B2 | 3/2011 | Brindle et al. | |
| 7,943,457 B2 | 5/2011 | Chudzik et al. | |
| 2007/0048925 A1 | 3/2007 | McStay et al. | |
| 2007/0111437 A1 * | 5/2007 | Cho et al. | 438/253 |
| 2011/0163382 A1 | 7/2011 | Rotondaro | |

OTHER PUBLICATIONS

Wu et al., I-Gate Body-Tied Silicon-on-Insulator MOSFETs With Improved High-Frequency Performance, IEEE Electron Device Letters, vol. 32, No. 4, Apr. 2011, pp. 443-445.

Lee et al., Record RF performance of 45-nm SOI CMOS Technology, 1-4244-0439-X/07, 2007 IEEE, pp. 255-258.

* cited by examiner

*Primary Examiner* — Karen Kusumakar
(74) *Attorney, Agent, or Firm* — Schmeiser, Olsen & Watts; Catherine Ivers

(57) ABSTRACT

A semiconductor device and method of making same. The device includes a substrate comprising a semiconductor layer on an insulating layer, the semiconductor layer including a semiconductor body having a body contact region and an abutting switching region; a bridged gate over the semiconductor body, the bridged gate having a bridge gate portion and an abutting gate portion, the bridge gate portion comprising a multilayer first gate stack and the gate portion comprising a multilayer second gate stack comprising the gate dielectric layer on the semiconductor body; first and second source/drains formed in the switching region on opposite sides of the channel; and wherein a first work function difference between the bridge portion and the body contact region is different from a second work function difference between the gate portion and the channel region.

34 Claims, 15 Drawing Sheets

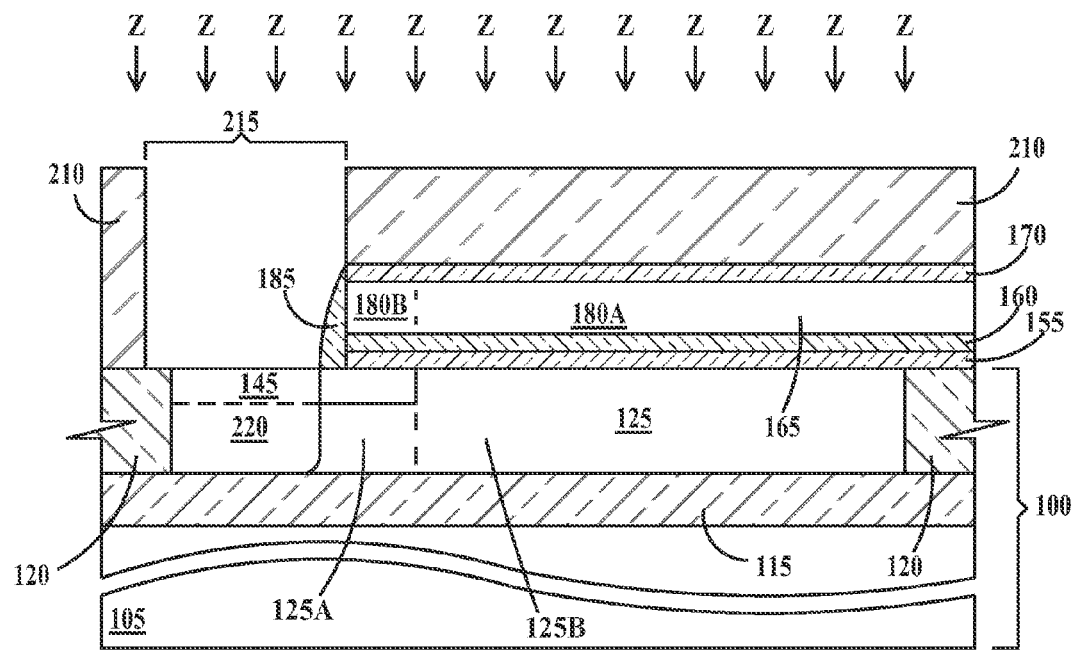
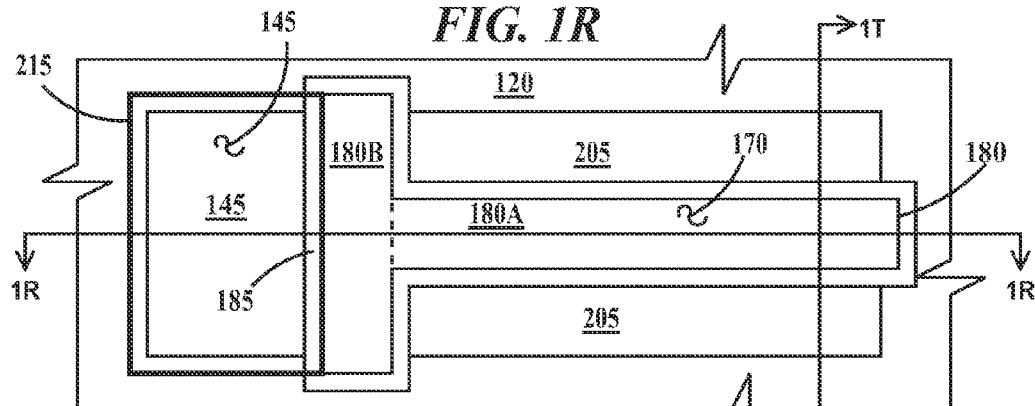
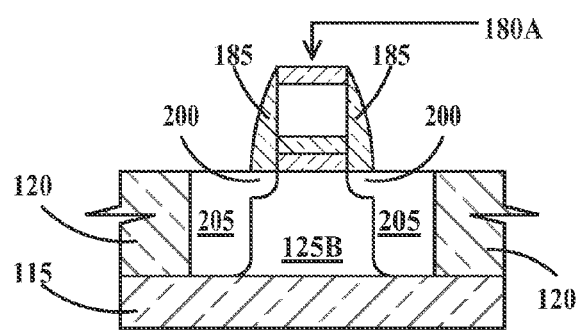

METHOD AND STRUCTURE FOR BODY CONTACTED FET WITH REDUCED BODY RESISTANCE AND SOURCE TO DRAIN CONTACT LEAKAGE

TECHNICAL FIELD

The present invention relates to the field of field effect transistors (FETs); more specifically, it relates to structures for body contacted Silicon on Insulator (SOI) FETs with reduced body resistance and source to drain leakage and methods of making body contacted SOI FETs with reduced body resistance and source to drain leakage.

BACKGROUND

To avoid floating body effects in FETs fabricated in silicon-on-insulator (SOI) substrates, highly doped body contacts have been used. However, the high doping in the body contact results in increased source/drain to body leakage, increased variation of threshold voltage of the FET (by diffusion of dopants from the body contact area) and increased junction capacitance. On the other hand, without a highly doped body contact the body contact resistance will be high reducing the effectiveness of the body contact. Accordingly, there exists a need in the art to mitigate the deficiencies and limitations of described hereinabove.

BRIEF SUMMARY

A first aspect of the present invention is a semiconductor device, comprising: a substrate comprising a semiconductor layer on an insulating layer, the semiconductor layer including a semiconductor body having a body contact region and an abutting switching region; trench isolation about the entire perimeter of the semiconductor body; a bridged gate over the semiconductor body, the bridged gate having a bridge gate portion and an abutting gate portion, the bridge gate portion formed over a less than whole region of the body contact region and the gate portion formed over a channel region of the switching region, the bridge gate portion comprising a multilayer first gate stack comprising a gate dielectric layer on the semiconductor body and a first metal gate layer and the gate portion comprising a multilayer second gate stack comprising the gate dielectric layer on the semiconductor body and a second metal gate layer; first and second source/drains formed in the switching region on opposite sides of the channel; and wherein a first work function difference between the bridge portion and the body contact region is different from a second work function difference between the gate portion and the channel region.

A second aspect of the present invention is a method of forming a semiconductor device, comprising: providing a substrate comprising a semiconductor layer on an insulating layer, the semiconductor layer including a semiconductor body having a body contact region and an abutting switching region; forming trench isolation about the entire perimeter of the semiconductor body; forming a bridged gate over the semiconductor body, the bridged gate having a bridge gate portion and an abutting gate portion, the bridge gate portion formed over a less than whole region of the body contact region and the gate portion formed over a channel region of the switching region, the bridge gate portion comprising a multilayer first gate stack comprising a gate dielectric layer on the semiconductor body and a first metal gate layer and the gate portion comprising a multilayer second gate stack comprising the gate dielectric layer on the semiconductor body and a second metal gate layer; forming first and second source/drains in the switching region on opposite sides of the channel; and wherein a first work function difference between the bridge portion and the body contact region is different from a second work function difference between the gate portion and the channel region.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
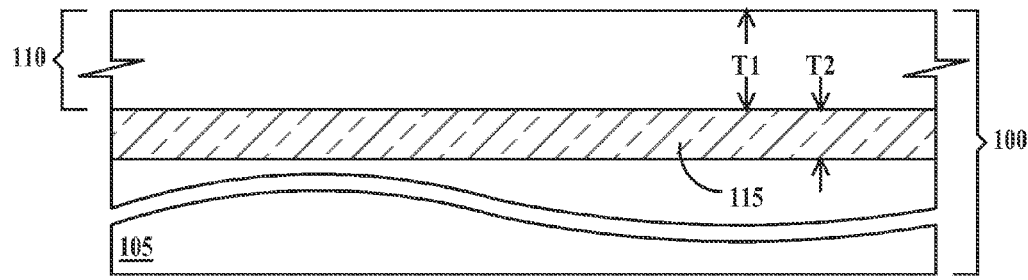
FIGS. 1A through 1T illustrate fabrication of a body contacted FET according to a first embodiment of the present invention.

The embodiments of the present invention provide a T-bridged gate FET having a T-bridged gate and a semiconductor (e.g., silicon) body. The T-bridged gate includes a bridge portion and a gate portion. The body is divided into a body contact region and a switching region. The switching region comprises source/drains on opposite sides of a channel region of the switching region of the body. The bridge portion is formed over a region of the body contact region and the gate portion is formed over the channel in the switching region. The embodiments of the present invention utilize a low dopant concentration in the entire switching region. The embodiments of the present invention utilize a low dopant concentration in the entire body contact region or in at least a region of the body contact region adjacent to the switching region. The low dopant level of the body contact region reduces drain/source to body leakage, drain/source to body contact junction capacitance and parametric variation in the device. The embodiments of the present invention also utilize tuning the work function of the bridge portion to body contact region relative to the work function of the gate portion to switching region to reduce the body resistance.

As used herein, a "P-type" semiconductor refers to the addition of trivalent impurities that create deficiencies of valence electrons to an intrinsic group IV semiconductor substrate, such as boron, aluminum or gallium to an intrinsic Si substrate. A P-type semiconductor may contain N-dopants but the net doping concentration is P-type.

As used herein, an "N-type" semiconductor refers to the addition of pentavalent impurities that contribute free electrons to an intrinsic group IV semiconductor substrate, such as antimony, arsenic or phosphorous dopants to an intrinsic Si substrate. An N-type semiconductor may contain P-dopants but the net doping concentration is N-type.

The term "anisotropic etch" denotes a material removal process in which the etch rate in the direction normal to the surface to be etched is greater than in the direction parallel to the surface to be etched.

Epitaxial deposition is the deposition of a crystalline layer on a crystalline substrate, where the crystal orientation of the deposited layer is in registry with the crystal orientation of the substrate. There must be one or more preferred crystal orientations for epitaxial growth to occur. The deposited layer is called an epitaxial film or epitaxial layer. It is preferred that the deposited crystalline layer have one well-defined orientation with respect to the substrate crystal structure.

In solid-state physics, the work function is the minimum energy (usually measured in electron volts) needed to remove an electron from a solid to a point immediately outside the solid surface (or energy needed to move an electron from the Fermi level into vacuum). The Fermi level is a level of potential energy for an electron inside a crystalline solid. Here "immediately" means that the final electron position is far from the surface on the atomic scale but still close to the solid on the macroscopic scale. The work function is a characteristic property for any solid phase of a substance with a conduction band (whether empty or partly filled). For a metal, the Fermi level is inside the conduction band, indicating that the band is partly filled. For an insulator, the Fermi level lies within the band gap, indicating an empty conduction band; in this case, the minimum energy to remove an electron is about the sum of half the band gap and the electron affinity. The band gap is an energy range where no electron states can exist. The band gap refers to the energy difference (in electron volts) between the top of the valence band and the bottom of the conduction band in insulators and semiconductors. In a non-degenerate semiconductor (having a moderate doping level), the Fermi level is located within the band gap. This means the work function is now different from the ionization energy (energy difference between valence bands maximum and vacuum level). In a semiconductor there are no allowed electronic states within the band gap. The electron affinity of an atom is defined as the amount of energy released when an electron is added to a neutral atom or molecule to form a negative ion.

FIGS. 1A through 1T illustrate fabrication of a body contacted FET according to a first embodiment of the present invention. In FIG. 1A, an SOI substrate 100 includes a supporting substrate 105 (e.g., a single crystal silicon substrate) separated from a semiconductor layer (e.g., a single-crystal silicon layer) 110 by a insulating layer 115. In one example, insulating layer 115 is silicon dioxide ($SiO_2$). Silicon layer 110 has a thickness T1 and insulating layer 115 has a thickness T2. In one example, T1 is between about 10 nm and about 100 nm. In one example, T2 is between about 100 nm and about 200 nm.

Figure 1B:
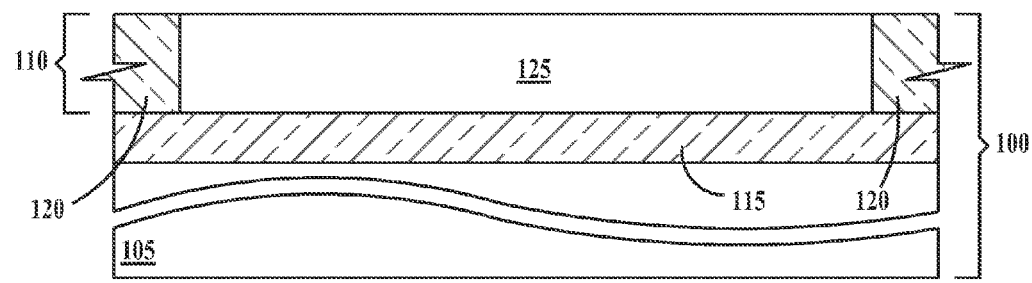

In FIG. 1B, dielectric trench isolation 120 is formed in semiconductor layer 110 to define a body 125. Trench isolation 120 extends from a top surface of silicon layer 110 to a top surface of insulating layer 115. In one example, trench isolation 120 is formed by etching trenches through semiconductor layer 110 using reactive ion etch (RIE) through a patterned mask formed on semiconductor layer 110, filling the trenches with a dielectric material, and performing a chemical-mechanical polish (CMP) process to remove excess dielectric material so a top surface of trench isolation 120 is coplanar with the top surface of semiconductor layer 110. Trench isolation 120 completely surrounds body 125, as illustrated in FIG. 1H and described infra. Body 125 is doped throughout its volume with either a P-dopant if an n-channel FET (NFET) is to be formed in body 125 or an N-dopant if a p-channel FET (PFET) is to be formed in body 125.

Figure 1C:
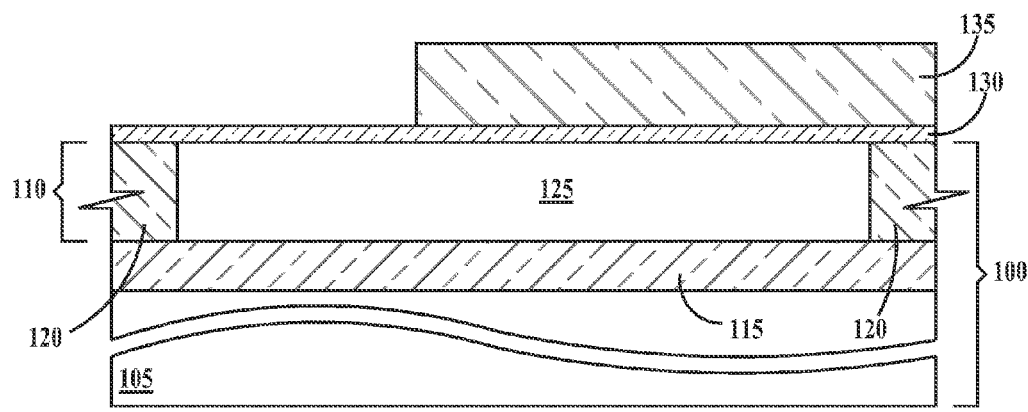
Figure 1D:
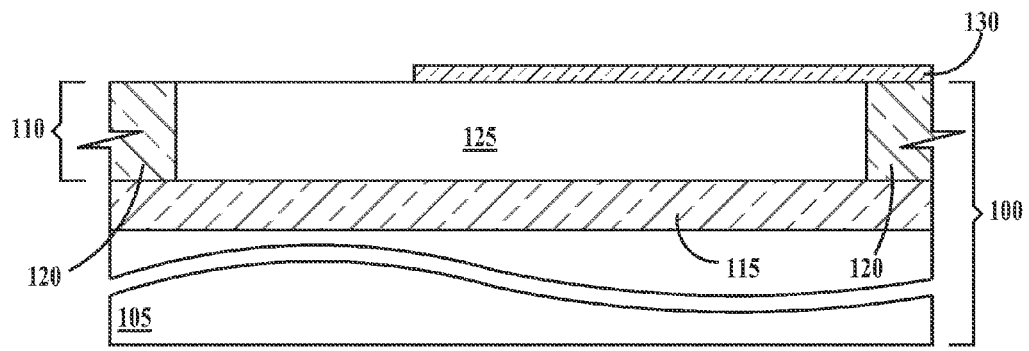

In FIG. 1C, a hardmask layer 130 is formed on the top surface of body 125 (and on the top surface of trench isolation 120 and a patterned photoresist layer 135 formed on the top surface of hardmask layer 130. In one example, hardmask layer is formed from one or more dielectric layers such as layers of $SiO_2$ and silicon nitride ($Si_3N_4$). In FIG. 1D, hardmask layer 130 is removed (e.g., by RIE) where not protected by photoresist layer 135 (see FIG. 1C).

Figure 1E:
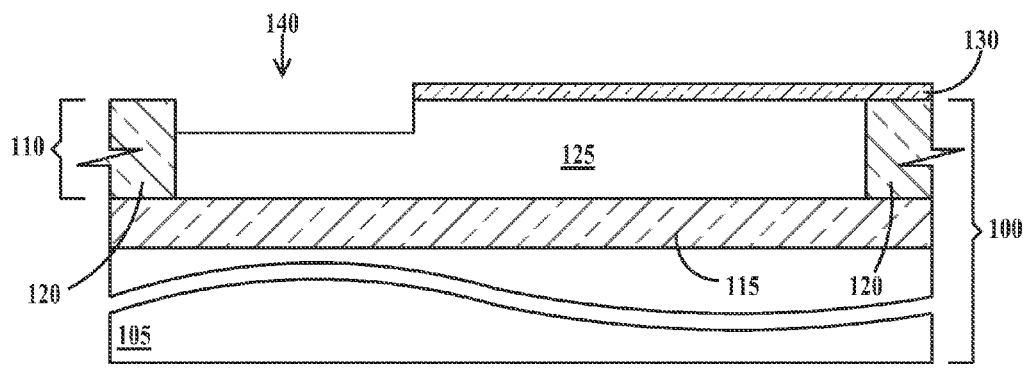
Figure 1F:
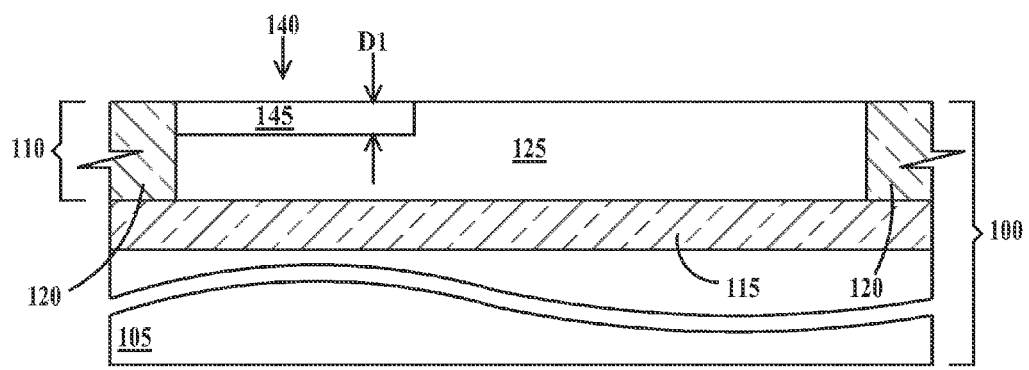

In FIG. 1E, a trench 140 is formed (e.g., by RIE) in body 125, where body 125 is not protected by hardmask layer 130 and in FIG. 1F, trench 140 is filled with a semiconductor material to form an upper body contact 145. Trench 140 is etched into, but not completely through body 125 using, for example, a RIE. Trench 140 is filled, for example, by epitaxial deposition. A CMP may be optionally performed so a top surface of upper body contact 145 is coplanar with the top surface of body 125. Upper body contact 145 extends a distance D1 into body 125. In one example, D1 is between about 9 nm and about 90 nm. Upper body contact may be further doped P-type for an NFET and N-type for a PFET. In one example, upper body contact does not extend to insulating layer 115.

Figure 1G:
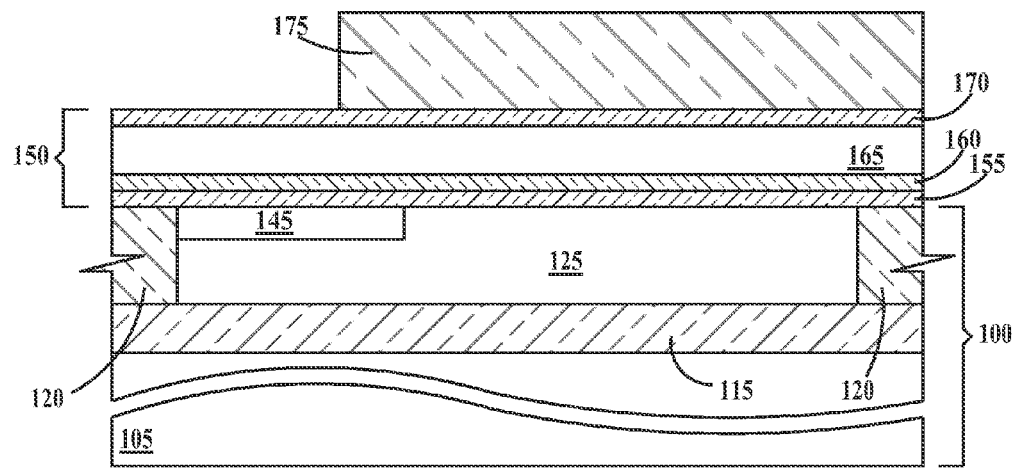
Figure 1H:
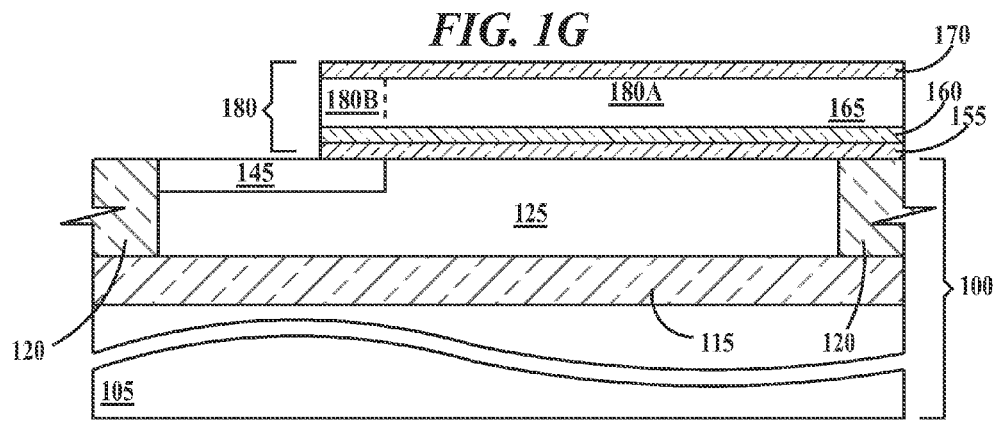

In FIG. 1G, a gate stack 150 is formed over trench isolation 120, body 125 and upper body contact 145. Gate stack 150 includes a gate dielectric layer 155 (which in one example is a high-K (dielectric constant) layer) on the top surface of trench isolation 120, body 125 and upper body contact 145, an optional tuning layer 160, a gate metal layer 165, and an optional capping layer 170. A patterned photoresist layer 175 is formed on capping layer 170. Tuning layer 160 provides further tuning of the gate to semiconductor work function. Examples of high-K materials include but are not limited to metal oxides such as tantalum oxide ($Ta_2O_5$), barium titanate ($BaTiO_3$), hafnium oxide ($HfO_2$), zirconium oxide ($ZrO_2$), aluminum oxide ($Al_2O_3$), lanthanum oxide ($La_2O_3$), metal silicates such as hafnium silicate ($HfSi_xO_y$) and $HfSi_xO_yN_z$. A high-K dielectric material has a relative permittivity above about 10. In one example, gate dielectric layer 155 is about 10 Å to about 30 Å thick. In one example, tuning layer 160 comprises a material selected from the group consisting of metal oxides such as $Ta_2O_5$, $ZrO_2$, $Al_2O_3$, and $La_2O_3$. Gate dielectric layer 155 and tuning layer 160 may be formed, for example, by chemical vapor deposition (CVD) or atomic layer deposition (ALD). In one example, the tuning layer 160 is about 1 Å to about 5 Å thick. For an NFET, gate metal layer 165 is an N-metal. Examples of N-metals include but are not limited to N-doped polysilicon, tantalum (Ta), tantalum nitride (TaN) and neodymium (Nb). For a PFET, gate metal layer 165 is a P-metal. Examples of P-metals include but are not limited to P-doped polysilicon, tungsten nitride ($W_2N$, WN, $WN_2$), platinum (Pt) or combination of different metals like titanium (Ti) and Tungsten (W). N-metals, like N-type semiconductor are electron donors. P-metals, like P-type semiconductors are electron acceptors. In one example, gate metal layer 165 is about 10 nm to about 40 nm thick. Gate metal layer 165 can be one single metal or a composition of multiple metals. Suitable materials for dielectric capping layer 170 are metal oxides like $Ta_2O_5$, $ZrO_2$, $Al_2O_3$, and $La_2O_3$ In one example, dielectric capping layer 170 is about 1 A to about 4 A thick.

Figure 1I:
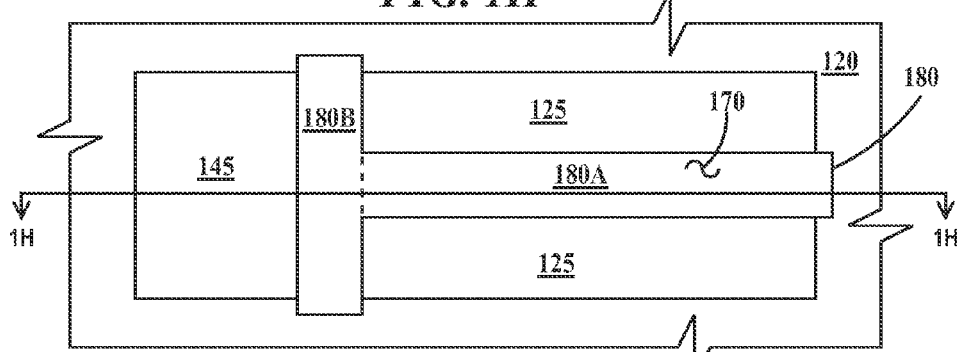

In FIG. 1H, gate stack 150 (see FIG. 1g) has been removed (e.g., by a RIE) where not protected by photoresist layer 175 and photoresist layer 175 then removed (see FIG. 1G). FIG. 1H is a cross-section view through line 1H-1H of the top view of FIG. 1I. Referring to both FIGS. 1H and 1I, it can be seen that a bridged gate 180 includes a gate portion 180A and a bridge portion 180B. At least a portion of bridge portion 180B is always formed over upper body contact 145. The boundary (dashed lines of FIGS. 1H and 1I) between bridge portion 180B and gate portion 180A may align with the edge of upper body contact 145 as illustrated in FIG. 1O. The boundary may be moved to the right in FIGS. 1H and 1I (but a region of bridge portion 180B must still be over upper body contact 145). The boundary may be moved to the left in FIGS. 1H and 1I (but a region of bridge portion 180B must still be over upper body contact 145) to be over a region of body 125 not containing upper body contact 145. Because of the difference in materials between body 125 and upper body contact 145, the work function difference between the gate portion 180A and the body 125 will be different from the work function difference between the bridge region 180B and the upper body contact 145 as described supra.

Figure 1J:
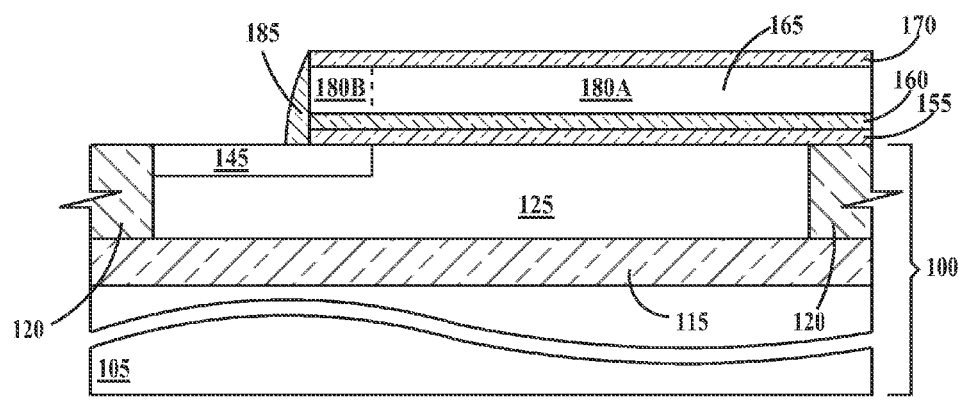
Figure 1K:
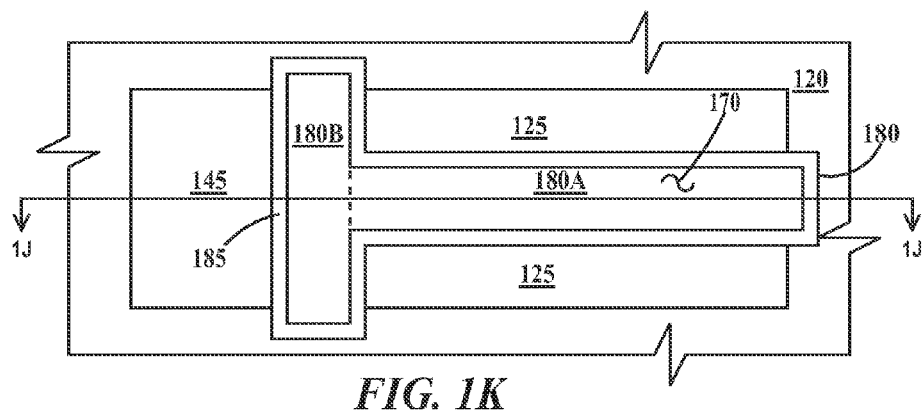

FIG. 1J is a cross-section through line 1J-1J of top view FIG. 1K In FIGS. 1J and 1K, a dielectric sidewall spacer 185 is formed on the sidewalls of T-bridged gate 180. Spacer 180 may be formed by a blanket deposition of a conformal dielectric layer followed by an anisotropic etch. A conformal layer is a layer of relative uniform thickness that follows the contours of the surface the layer is formed on. In one example, spacer 185 comprises a layer of $SiO_2$, a layer of $Si_3N_4$ or combinations of layers thereof. In one example, spacer 185 is formed by a blanket CVD followed by an RIE.

Figure 1L:
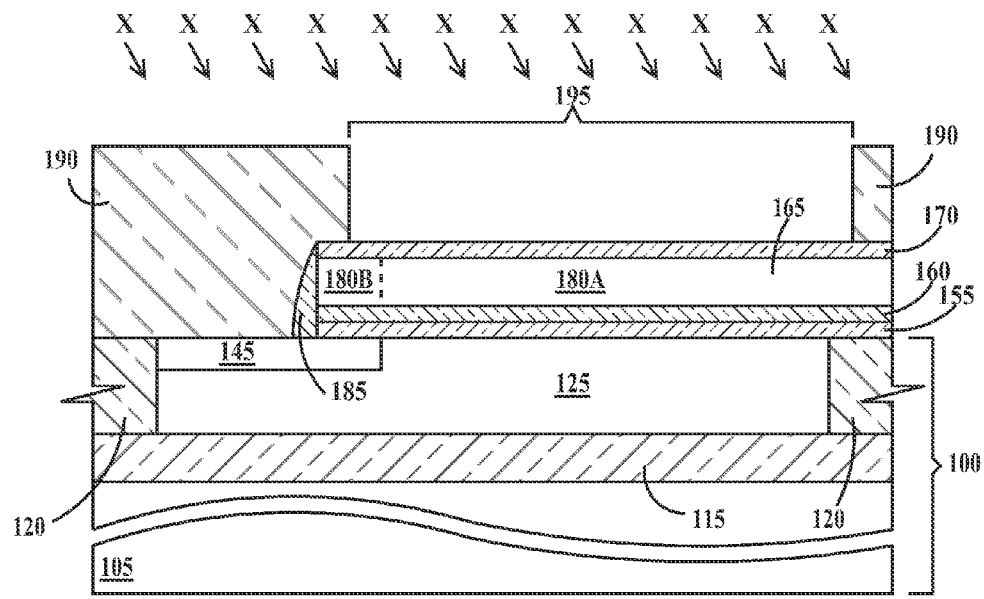
Figure 1M:
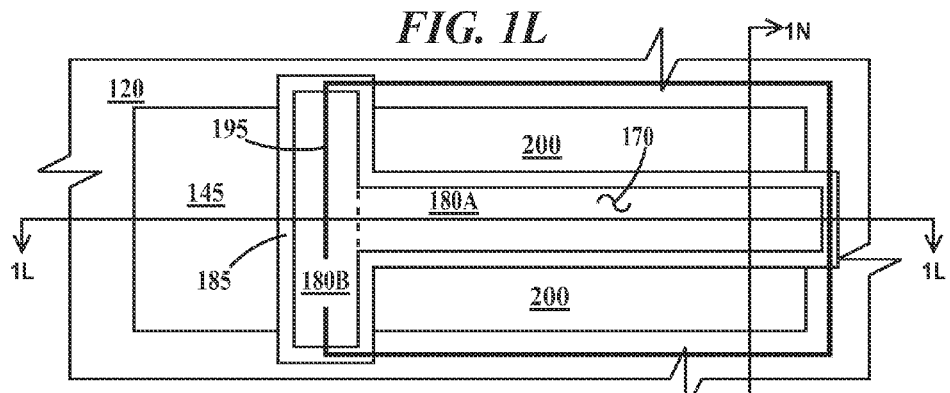
Figure 1N:
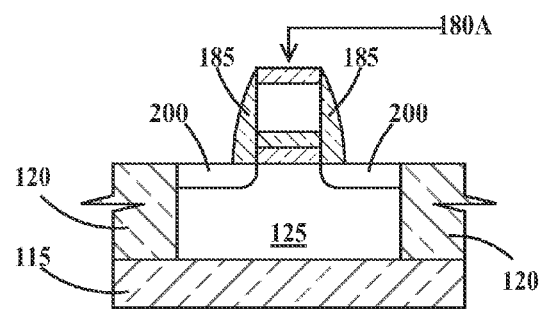
Figure 1O:
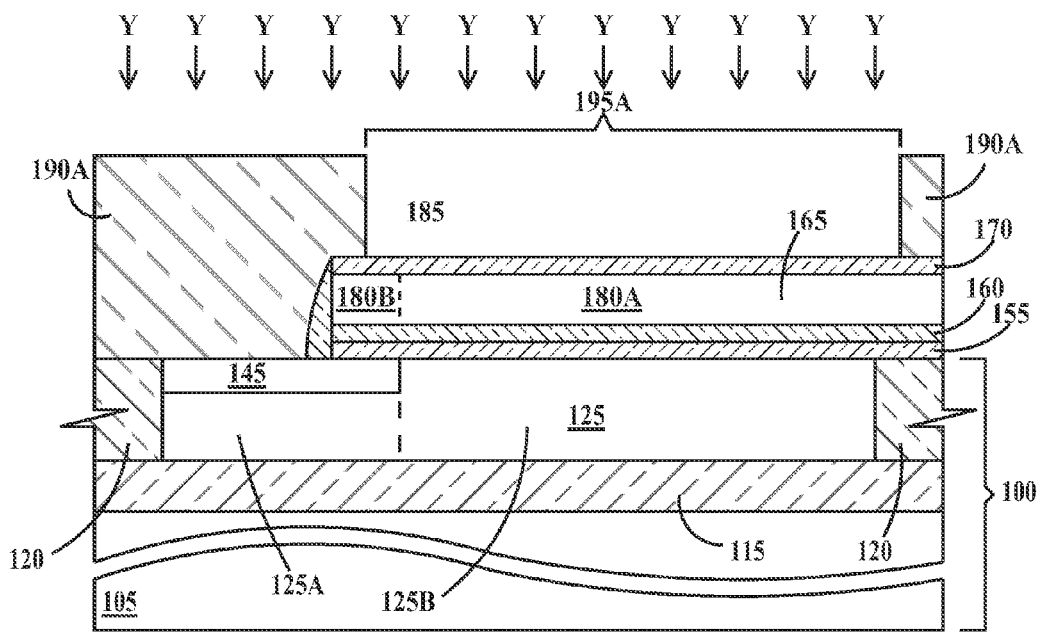

FIG. 1L is a cross-section through line 1L-1L of top view FIG. 1M and FIG. 1N is a cross-section through line 1N-1N of FIG. 1M. In FIG. 1L, a patterned photoresist layer 190 has an opening 195 over gate portion 180A and regions of body 125 on either side of gate portion 180A. An angled ion implantation (I/I) of dopants species X is performed while substrate 100 is rotated about an axis perpendicular to the top surface of body 125. The heavy line in FIG. 1M indicates the extent of opening 195. Photoresist layer 190 prevents implantation of species X into upper body contact 145. After removing photoresist layer 195 and performing a high temperature (e.g., between about 1000° K and about 1500° K) anneal such as a rapid thermal anneal (RTA) or laser spike anneal (LSA) to activate the dopant species, source/drain extensions 200 have been formed on either side of a body 125. For an NFET, species X is an N-type dopant and source/drain extensions 200 are N-type. For a PFET, species X is a P-type dopant and source/drain extensions 200 are P-type. The net dopant concentration of source/drain extensions is greater than the net doping concentration of body 125. Optionally, an additional halo I/I doping along with the source/drain extension doping could be performed for short channel devices.

Figure 1P:
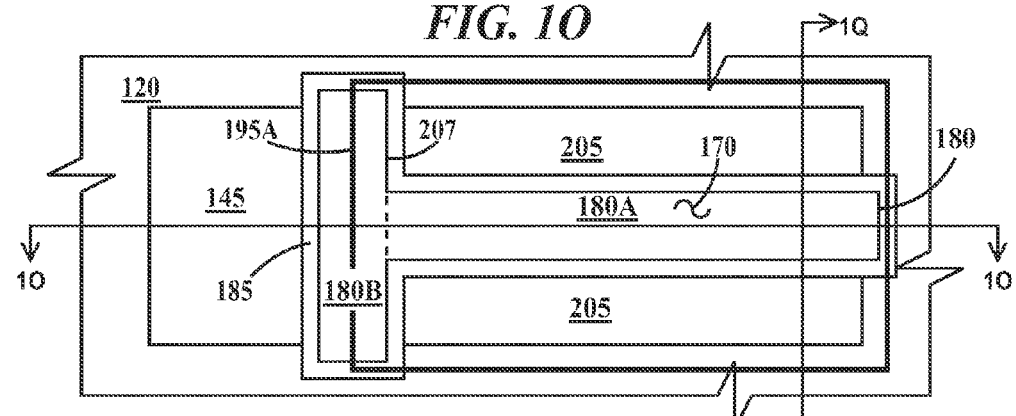
Figure 1Q:
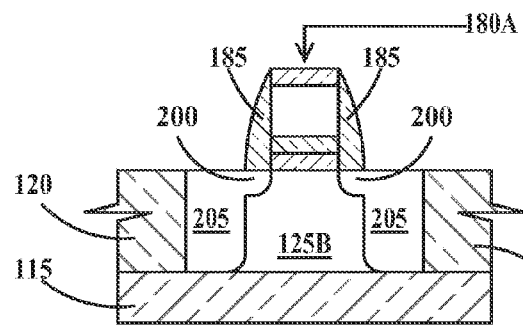

FIG. 1O is a cross-section through line 1O-1O of top view FIG. 1P and FIG. 1Q is a cross-section through line 1Q-1Q of FIG. 1P). In FIG. 1O, a patterned photoresist layer 190A has an opening 195A over gate portion 180A and regions of body 125 on either side of gate portion 180A. An I/I of dopants species Y is performed into gate portion 180A and regions of body 125 on opposite sides of gate portion 180A. The heavy line in FIG. 1P indicates the extent of opening 195A. Photoresist layer 190A prevents implantation of species Y into upper body contact 145. After removing photoresist layer 195A and performing a high temperature anneal such as a RTA or LSA to activate the dopant species, source/drains 205 have been formed on either side of channel region 125A. For an NFET, species Y is an N-type dopant and source/drains 205 are N-type. For a PFET, species Y is a P-type dopant and source/drains 205 are P-type. The net dopant concentration of source/drains 205 is greater than the net doping concentration of body 125. Body 125 is divided into a body contact region 125A and a switching region 125B as defined the leftmost edge 207 of bridge portion 180B that abuts gate portion 180A, so upper body contact 145 is formed in body contact region 125A. In FIG. 1Q, source/drains 205 are illustrated as abutting insulating layer 115. Alternatively, source/drains 205 may not extend down to and not abut insulating layer 115.

Upper body contact region 145 has a band gap different from the band gap of body 125, or an electron affinity different from the electron affinity of body 125 or both a band gap and an electron affinity different from the band gap and electron affinity of body 125. For an NFET, the band gap of upper body contact 145 is narrower than the band gap of body 125. For a PFET, the band gap of upper body contact 145 is wider than the band gap of body 125. For an NFET, the electron affinity of upper body contact 145 is lower than the electron affinity of body 125. For a PFET, the electron affinity of upper body contact 145 is higher than the electron affinity of body 125. Thus, the work-function of bridge portion 180B of T-bridge gate 180 over upper body contact 145 will be different than the work function of gate portion 180B of T-bridge gate 180 over switching region 125B of body 125. In one example, when body 125 is silicon, upper body contact may comprise germanium (Ge) or silicon-germanium (SiGe) for an NFET or gallium arsenide (GaAs) or gallium phosphide (GaP) for a PFET.

FIG. 1R is a cross-section through line 1R-1R of top view FIG. 1S and FIG. 1T is a cross-section through line 1T-1T of FIG. 1S of optional steps in the formation of a T-bridges gate FET. In FIG. 1R, a patterned photoresist layer 210 has an opening 215 over upper body contact 145. Opening 145 does not extend over gate portion 180A or source/drains 205. An I/I of dopants species Z is performed into upper body contact. The heavy line in FIG. 1S indicates the extent of opening 215. Photoresist layer 210 prevents implantation of species Z into gate portion 180A and source/drains 205. After removing photoresist layer 210 and performing a high temperature anneal such as a RTA or LSA to activate the dopant species, a diffused body contact 220 has been formed extending through upper body contact 145 into body 125 under upper body contact 145. For an NFET, species Z is a P-type dopant and body contact 220 is P-type. For a PFET, species Z is an N-type dopant and body contact 220 is N-type. The net dopant concentration of diffused body contact 220 is greater than the net doping concentration of body 125. When forming an NFET, the same photoresist layer and I/I used to form the source/drains of a PFET may be used to form body contact 220. When forming a PFET, the same photoresist layer and I/I used to form the source/drains of an NFET may be used to form diffused body contact 220.

Figure 2A:
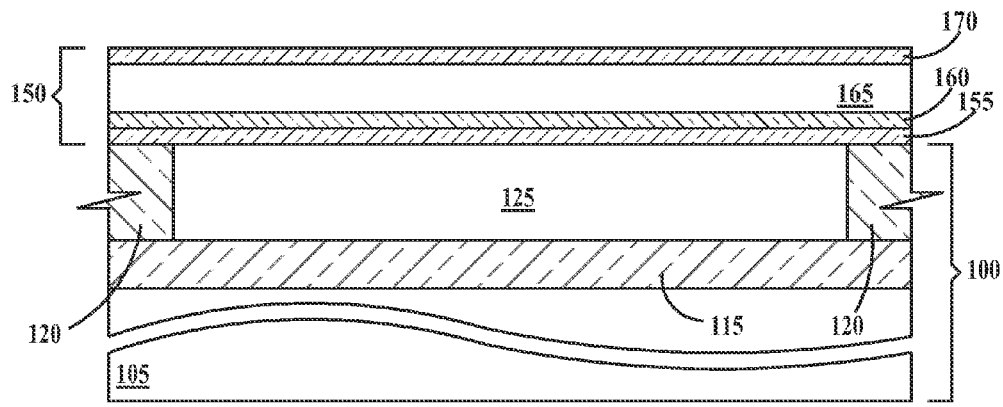
FIGS. 2A through 2J illustrate fabrication of a body contacted FET according to a second embodiment of the present invention.
Figure 2B:
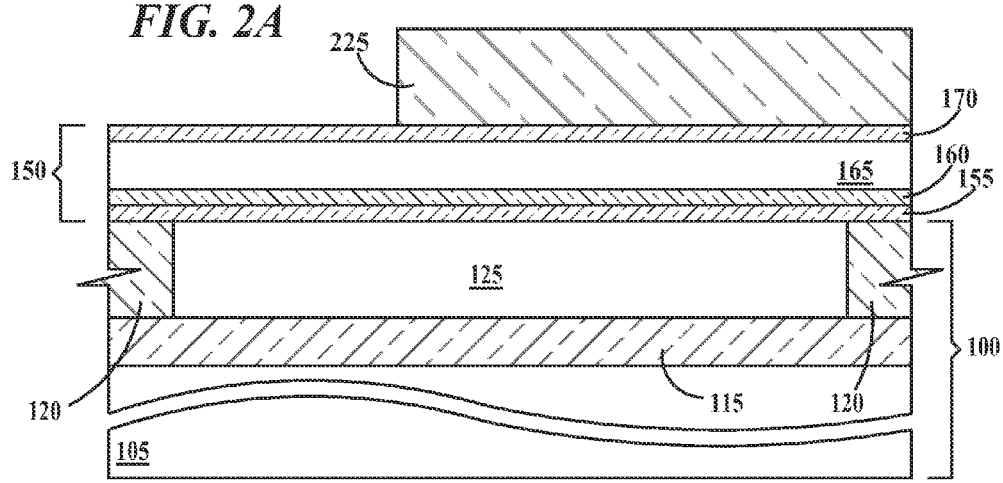
Figure 2C:
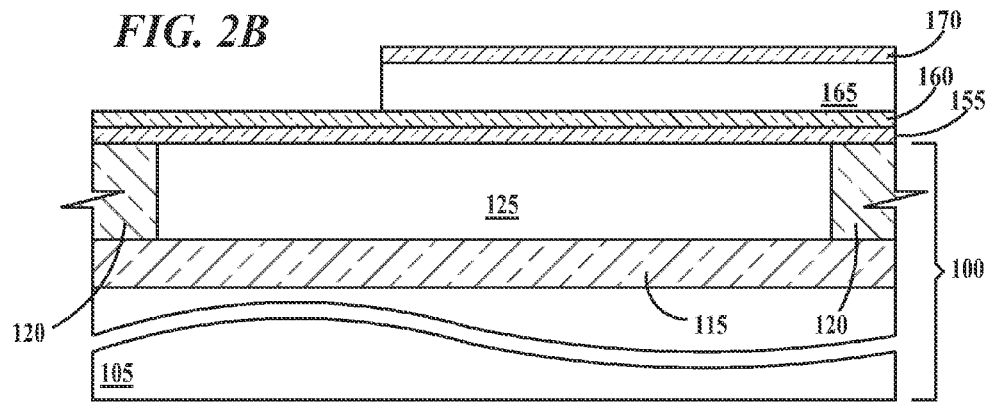
Figure 2D:
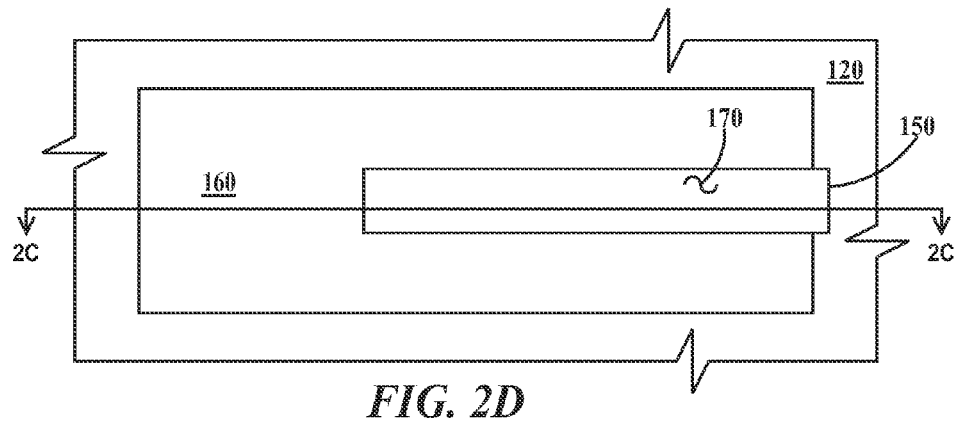

FIGS. 2A through 2J illustrate fabrication of a body contacted FET according to a second embodiment of the present invention. In FIG. 2A, trench isolation 120 has been formed in substrate 100 and gate stack 150 has been formed on top of trench isolation 120 and body 125 as discussed supra. In FIG. 2B, a patterned photoresist layer 225 is formed on capping layer 170. In FIG. 2C, capping layer 170 and gate metal layer 165 are removed (e.g., by RIE) where gate stack 150 was not protected by photoresist layer 225, and photoresist layer 225 removed (see FIG. 2B). FIG. 2C is a cross section through line 2C-2C of FIG. 2D. In FIG. 2D, only a portion of the full gate stack 150 remains. The remaining portion of gate stack 150 will become the gate portion of a T-bridged gate after further processing.

Figure 2E:
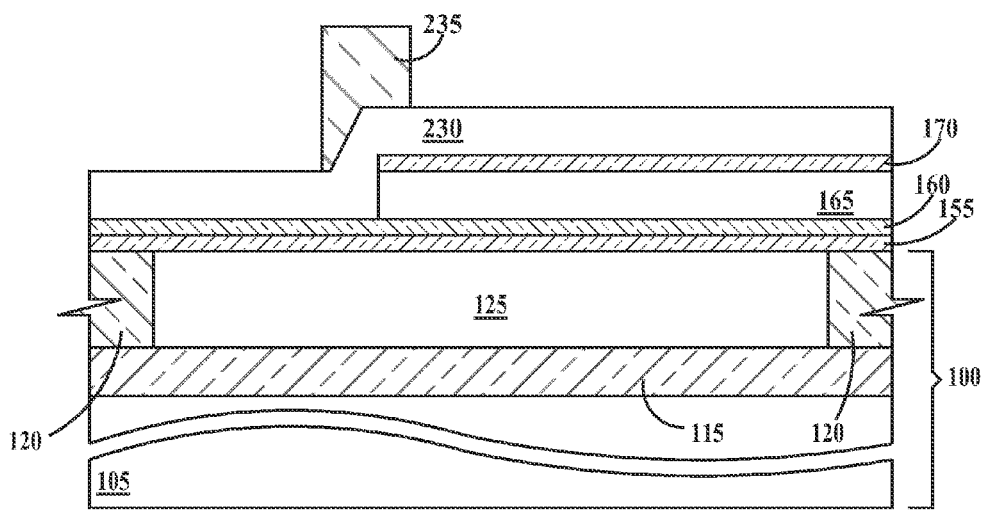

In FIG. 2E, a gate metal layer 230 is deposited. Gate metal layer 230 must have a different work function than gate metal layer 165. Gate metal layer 230 must be a different metal type than gate metal layer 165. For an NFET gate metal layer 165 is an N-metal and gate metal layer 230 is a P-metal. For a PFET gate metal layer 165 is a P-metal and gate metal layer 230 is an N-metal. Examples of N-metals and P-metals were given supra. Also in FIG. 2E a patterned photoresist layer 235 has been formed on gate metal layer 230. Photoresist layer 235 will define the extent of a bridge gate portion of a T-bridged gate after further processing.

Figure 2F:
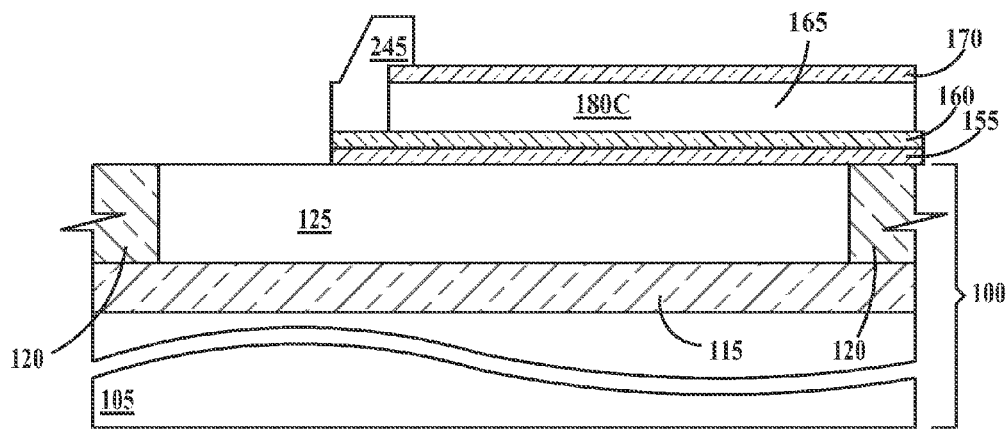
Figure 2G:
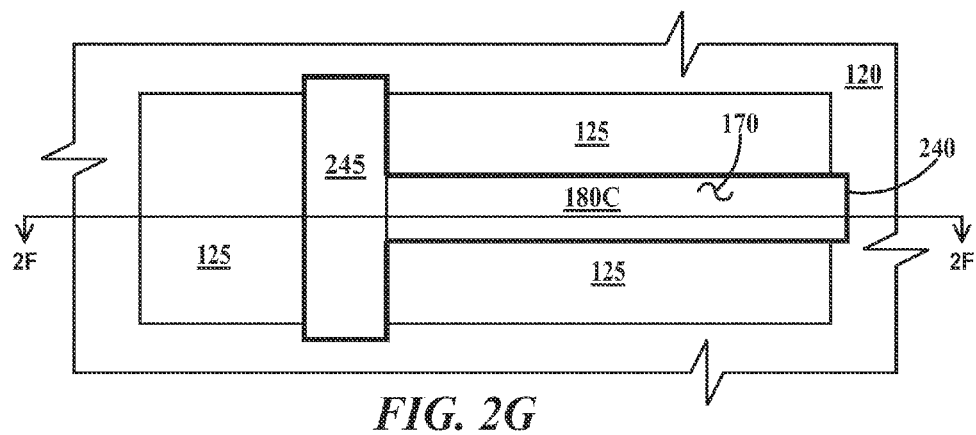

FIG. 2F is a cross section through line 2F-2F of top view FIG. 2G. In FIGS. 2F and 2G, metal gate stack 230 (see FIG. 2E), tuning layer 160 and gate dielectric layer 155 have been removed where not protected by photoresist later 235 (see FIG. 2E) or capping layer 170 to form a T-bridged gate 240 (heavy line) having a gate portion 180C and a bridge portion 245.

Figure 2H:
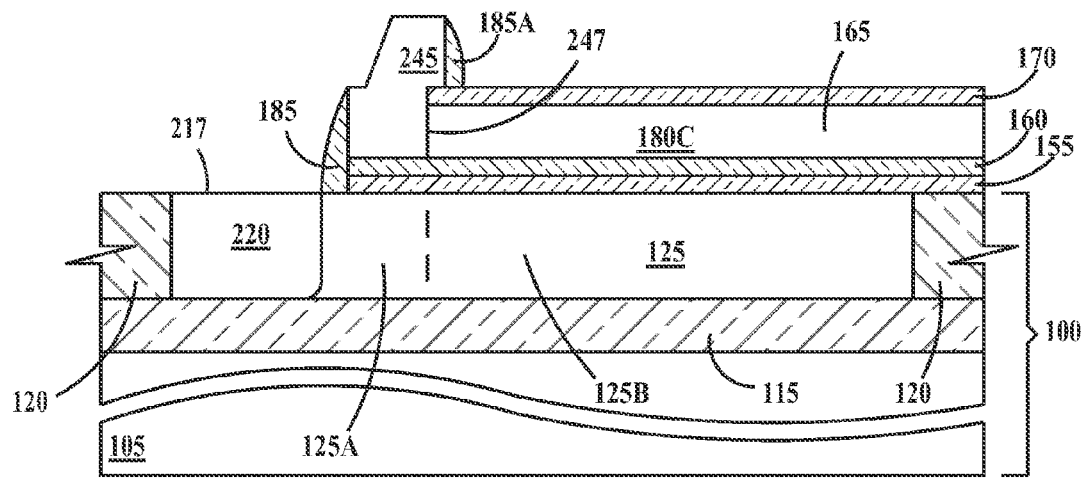
Figure 2I:
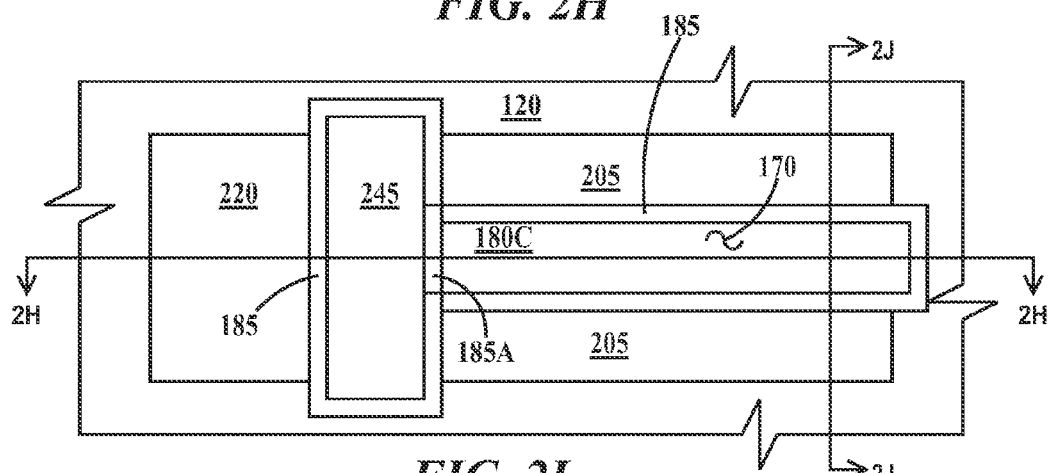
Figure 2J:
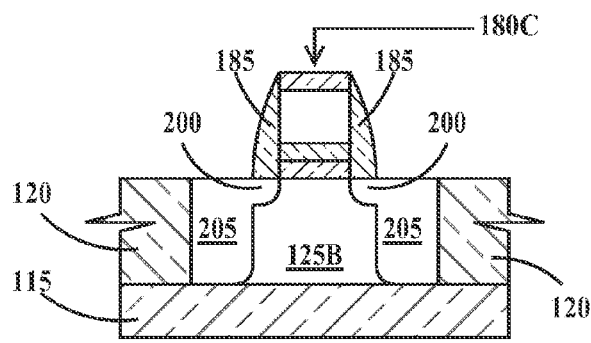

FIG. 2H is a cross-section through line 2H-2H of top view FIG. 2I and FIG. 2J is a cross-section through line 2J-2J of FIG. 2I after formation of dielectric spacers 185, source/drain extensions 200, source/drains 205 and optional body contact 220 as described supra. Bridge portion 245 has a higher work function than gate portion 180C for an NFET. Bridge portion 245 has a lower work function than gate portion 180C for a PFET. So, when the channel in the switching region is depleted or inverted the body contact region remains in accumulation and body resistance remains low. Again, body 125 is divided into a body contact region 125A and a switching region 125B as defined by the leftmost edge 247 of bridge portion 245 that abuts gate portion 180C.

Figure 3A:
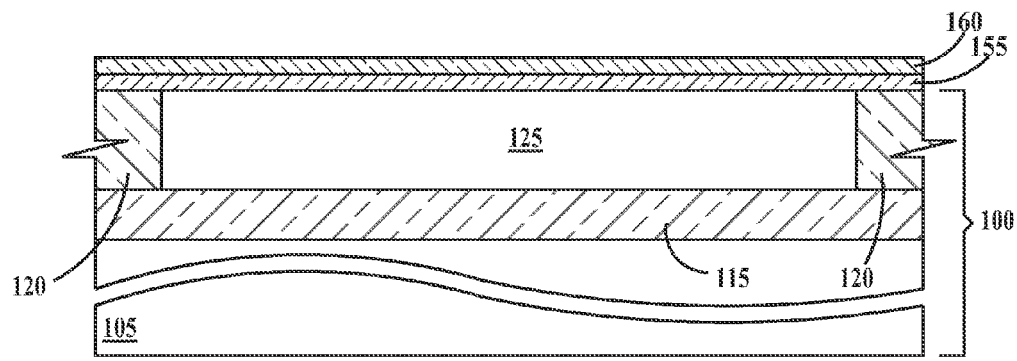
FIGS. 3A through 3J illustrate fabrication of a body contacted FET according to a third embodiment of the present invention.
Figure 3B:
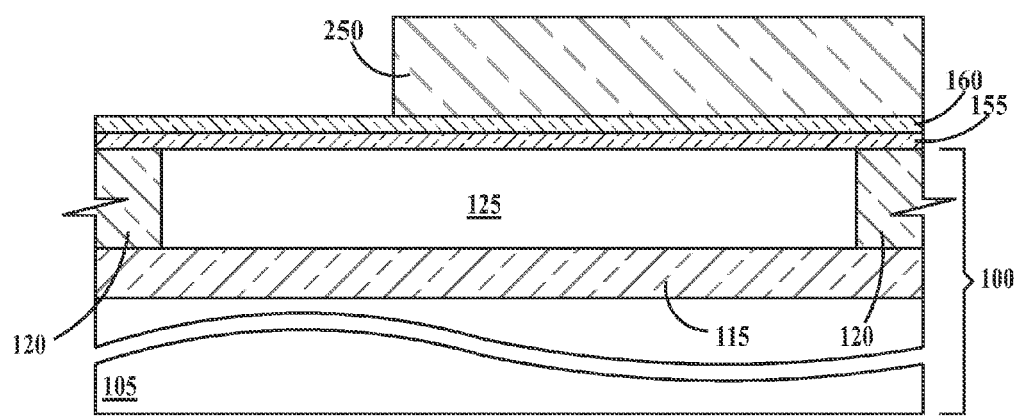
Figure 3C:
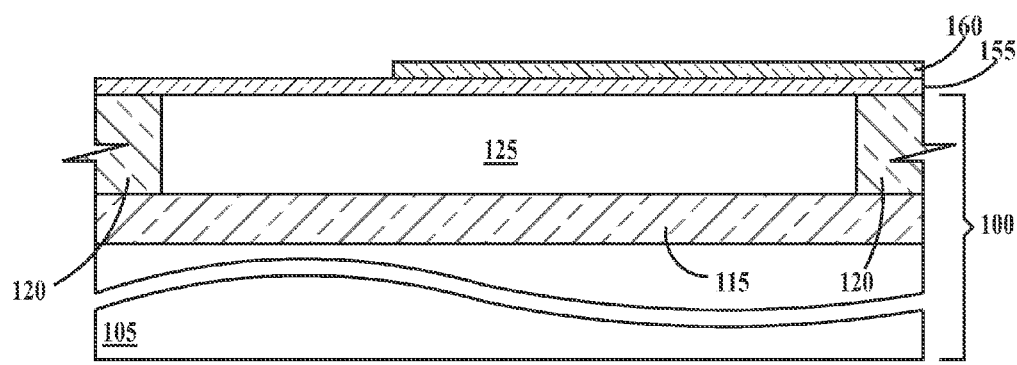

FIGS. 3A through 3J illustrate fabrication of a body contacted FET according to a third embodiment of the present invention. In FIG. 3A, trench isolation 120 has been formed in substrate 100 and the gate dielectric layer 155 and tuning layer 160 have been formed on top of trench isolation 120 and body 125 as discussed supra. In this embodiment, tuning layer 160 is not optional. In FIG. 3B, a patterned photoresist layer 250 is formed on tuning layer 160. In FIG. 3C, tuning layer 160 is removed (e.g., by RIE) where tuning layer 160 was not protected by photoresist layer 250, and photoresist layer 250 is removed (see FIG. 3B). Gate dielectric layer 155 is not removed.

Figure 3D:
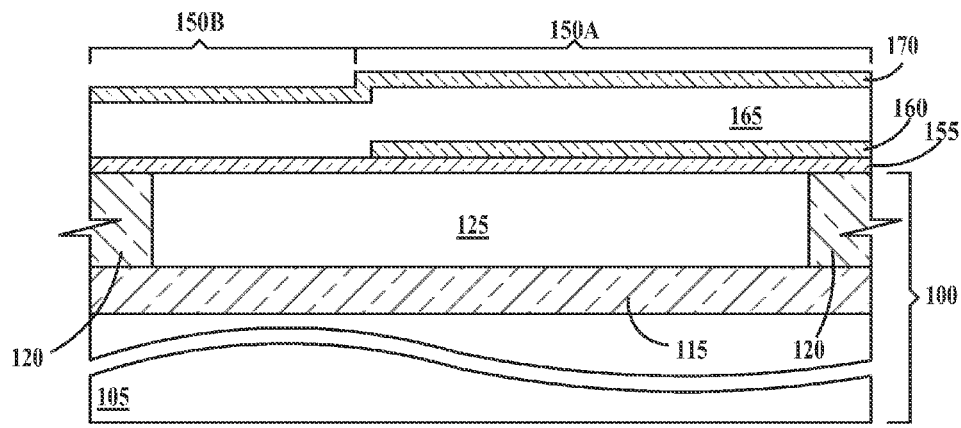

In FIG. 3D, gate metal layer 165 is formed on tuning layer 160 and gate dielectric layer 155 where the tuning layer has been removed (see FIG. 3B) and optional capping layer 170 is formed on gate metal layer 165. Thereby, a first gate stack 150A comprising gate dielectric layer 155, tuning layer 160, gate metal layer 165 and capping layer 170 and a second contiguous gate stack 150B comprising gate dielectric layer 155, gate metal layer 165 and capping layer 170 have been formed.

Figure 3E:
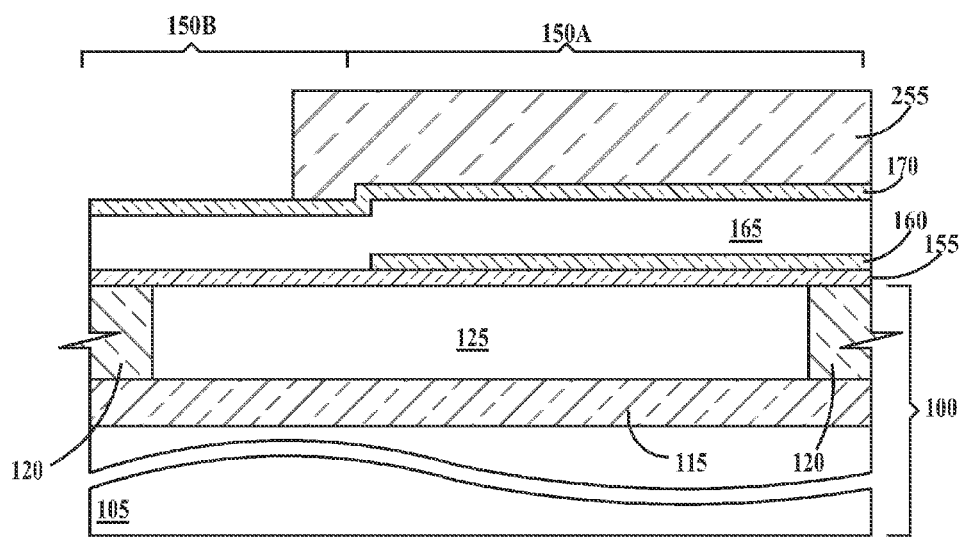
Figure 3F:
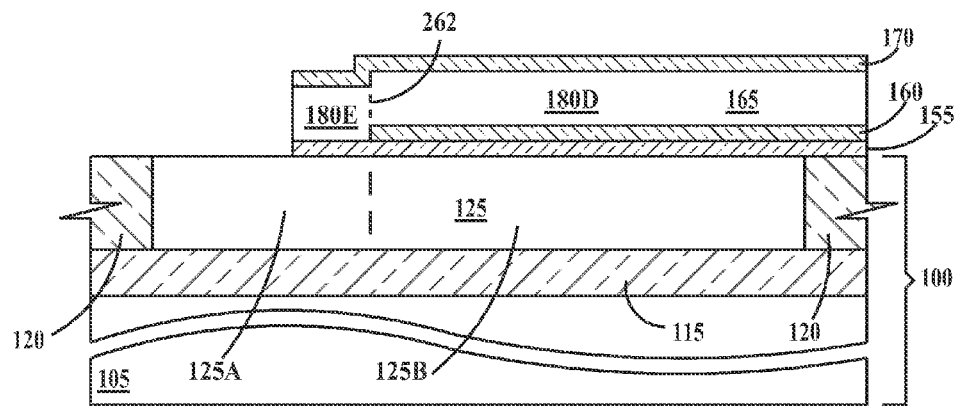
Figure 3G:
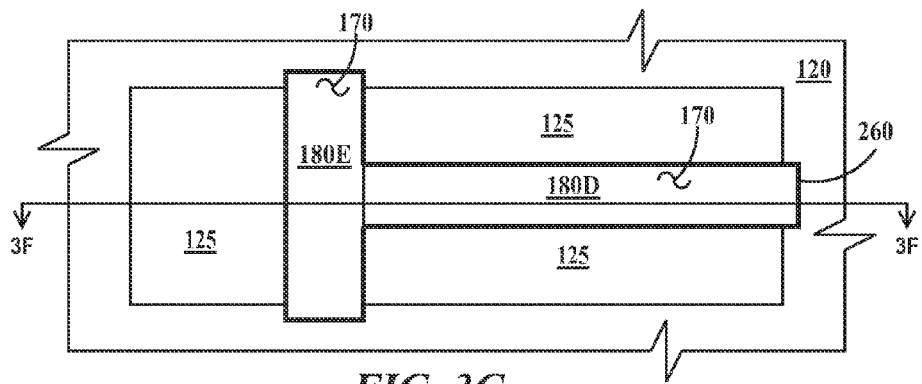

In FIG. 3E, a patterned photoresist layer 255 is formed on capping layer 170. FIG. 3F is a cross-section view through line 3F-3F of the top view of FIG. 3G. In FIGS. 3F and 3G, the regions of gate stacks 150A and 150B (see FIG. 3E) have been removed (e.g., by a RIE) where not protected by photoresist layer 255 (see FIG. 3E) and photoresist layer 255 then removed. Referring to both FIGS. 3F and 3G, it can be seen that a bridged gate 260 (heavy lines) includes a gate portion 180D and a bridge portion 180E. Again, body 125 is divided into a body contact region 125A and a switching region 125B as defined by the leftmost edge 262 of bridge portion 180E that abuts gate portion 180D.

Figure 3H:
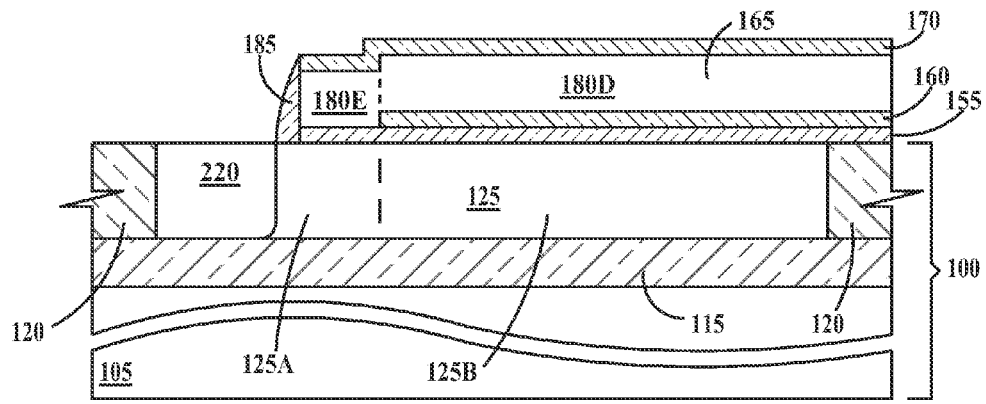
Figure 3I:
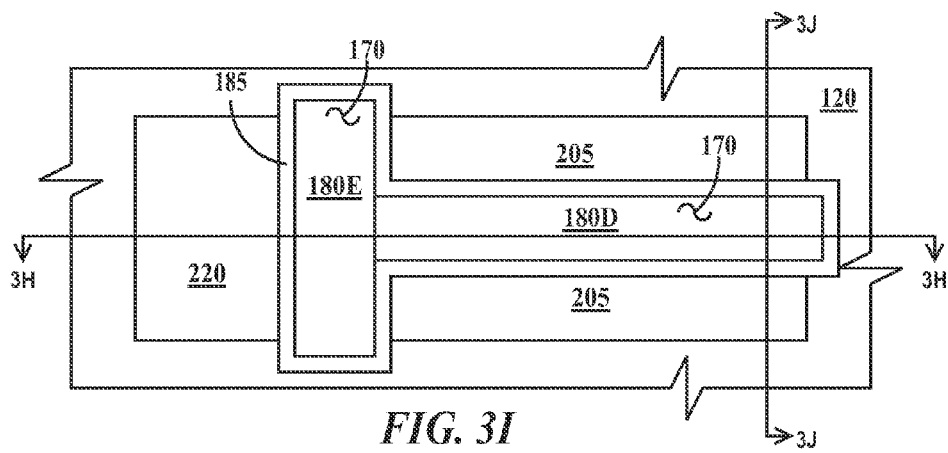
Figure 3J:
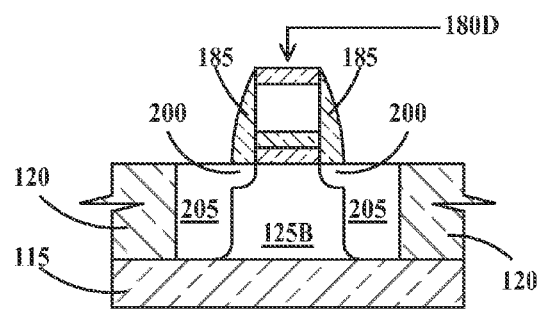

FIG. 3H is a cross-section through line 3H-3H of top view FIG. 3I and FIG. 3J is a cross-section through line 3J-3J of FIG. 3I after formation of dielectric spacers 185, source/drain extensions 200, source/drains 205 and optional body contact 220 as described supra. For an NFET, bridge portion 180E has a higher work function than gate portion 180D because of the absence of tuning layer 160 in bridge portion 180E. For a PFET, bridge portion 180E has a lower work function than gate portion 180D because of the absence of tuning layer 160 in bridge portion 180E.

Thus, the embodiments of the present invention provide structures for body contacted FETs with decreased source/drain to body leakage and decreased body resistance and methods of making body contacted FETs with decreased source/drain to body contact leakage and decreased body resistance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a substrate comprising a semiconductor layer on an insulating layer, the semiconductor layer including a semiconductor body having a body contact region and an abutting switching region;
trench isolation about the entire perimeter of said semiconductor body;
a bridged gate over said semiconductor body, said bridged gate having a bridge gate portion and an abutting gate portion, said bridge gate portion formed over a less than whole region of said body contact region and said gate portion formed over a channel region of said switching region, said bridge gate portion comprising a multilayer first gate stack comprising a gate dielectric layer on said semiconductor body and a first metal gate layer and said gate portion comprising a multilayer second gate stack comprising said gate dielectric layer on said semiconductor body and a second metal gate layer;
first and second source/drains formed in said switching region on opposite sides of said channel;
wherein a first work function difference between said bridge portion and said body contact region is different from a second work function difference between said gate portion and said channel region; and
wherein said first gate metal layer and said second gate metal layer are different layers comprised of different materials and all other layers of said first gate stack and said second gate stack are the same layers.

2. A semiconductor device, comprising:
a substrate comprising a semiconductor layer on an insulating layer, the semiconductor layer including a semiconductor body having a body contact region and an abutting switching region;
trench isolation about the entire perimeter of said semiconductor body;
a bridged gate over said semiconductor body, said bridged gate having a bridge gate portion and an abutting gate portion, said bridge gate portion formed over a less than whole region of said body contact region and said gate portion formed over a channel region of said switching region, said bridge gate portion comprising a multilayer first gate stack comprising a gate dielectric layer on said semiconductor body and a first metal gate layer and said gate portion comprising a multilayer second gate stack comprising said gate dielectric layer on said semiconductor body and a second metal gate layer;
first and second source/drains formed in said switching region on opposite sides of said channel;
wherein a first work function difference between said bridge portion and said body contact region is different from a second work function difference between said gate portion and said channel region;

an upper body contact in said body contact region, a top surface of said upper body contact coplanar with a top surface of said semiconductor body, said upper body contact extending under said bridge gate portion and not extending to said insulating layer; and wherein said first gate metal layer and said second gate metal layer are the same layer and doped a same single dopant type.

3. The semiconductor device of claim 2, wherein:

when said semiconductor device is an NFET, (i) said upper body contact region has a band gap that is narrower than a band gap of said semiconductor body or (ii) said upper body contact has an electron affinity that is lower than an electron affinity of said semiconductor body or (iii) said upper body contact region has a band gap that is narrower than a band gap of said semiconductor body and has an electron affinity that is lower than the electron affinity of said semiconductor body; and when said semiconductor device is a PFET, (iv) said upper body contact region has a band gap that is wider than a band gap of said semiconductor body or (v) said upper body contact has an electron affinity that is higher than an electron affinity of said semiconductor body or (vi) said upper body contact region has a band gap that is wider than a band gap of said semiconductor body and has an electron affinity that is higher than the electron affinity of said semiconductor body.

4. The semiconductor device of claim 1, wherein:

when said semiconductor device is an NFET, said first metal gate layer of said bridge gate portion is a P-metal and said second metal gate layer of said gate portion is an N-metal; and when said semiconductor device is a PFET, said first metal gate layer of said bridge gate portion is an N-metal and said second metal gate layer of said gate portion is a P-metal.

5. A semiconductor device, comprising:

a substrate comprising a semiconductor layer on an insulating layer, the semiconductor layer including a semiconductor body having a body contact region and an abutting switching region;

trench isolation about the entire perimeter of said semiconductor body;

a bridged gate over said semiconductor body, said bridged gate having a bridge gate portion and an abutting gate portion, said bridge gate portion formed over a less than whole region of said body contact region and said gate portion formed over a channel region of said switching region, said bridge gate portion comprising a multilayer first gate stack comprising a gate dielectric layer on said semiconductor body and a first metal gate layer and said gate portion comprising a multilayer second gate stack comprising said gate dielectric layer on said semiconductor body and a second metal gate layer;

first and second source/drains formed in said switching region on opposite sides of said channel;

wherein a first work function difference between said bridge portion and said body contact region is different from a second work function difference between said gate portion and said channel region;

wherein said first gate stack includes said gate dielectric layer, said first metal gate layer on a top surface of said gate dielectric layer;

wherein said second gate stack includes said gate dielectric layer, a tuning layer on a top surface of said gate dielectric layer, and said second metal gate layer on a top surface of and tuning layer; and said first gate metal layer and said second gate metal layer are the same layer, said tuning layer comprising a different material then said first metal gate layer and said second metal gate layer, said tuning only under said gate portion of said bridged gate.

6. The semiconductor device of claim 1, wherein:

when said semiconductor device is an NFET, said body contact region and said switching region are both doped P-type; and when said semiconductor device is a PFET, said body contact region and said switching region are both doped N-type.

7. The semiconductor device of claim 1, wherein:

said bridged gate is in the form of a T, a longitudinal axis said gate portion of said bridged gate runs in a first direction and a longitudinal axis said bridge portion of said bridged gate runs in a second direction, said second direction perpendicular to said first direction.

8. The semiconductor device of claim 1, wherein:

said trench isolation extends from a top surface of said semiconductor layer through said semiconductor layer to a top surface of said insulating layer; and a top surface of said trench isolation is coplanar with said top surface of said semiconductor layer.

9. The semiconductor device of claim 1, further including:

a same dielectric capping layer on top surfaces of said first and second metal gate layers.

10. A method of forming a semiconductor device, comprising:

providing a substrate comprising a semiconductor layer on an insulating layer, the semiconductor layer including a semiconductor body having a body contact region and an abutting switching region;

forming trench isolation about the entire perimeter of said semiconductor body;

forming a bridged gate over said semiconductor body, said bridged gate having a bridge gate portion and an abutting gate portion, said bridge gate portion formed over a less than whole region of said body contact region and said gate portion formed over a channel region of said switching region, said bridge gate portion comprising a multilayer first gate stack comprising a gate dielectric layer on said semiconductor body and a first metal gate layer and said gate portion comprising a multilayer second gate stack comprising said gate dielectric layer on said semiconductor body and a second metal gate layer;

forming first and second source/drains in said switching region on opposite sides of said channel;

wherein a first work function difference between said bridge portion and said body contact region is different from a second work function difference between said gate portion and said channel region; and wherein said first gate metal layer and said second gate metal layer are different layers comprised of different materials and all other layers of said first gate stack and said second gate stack are the same layers.

11. A Method of forming a semiconductor device, comprising:

providing a substrate comprising a semiconductor layer on an insulating layer, the semiconductor layer including a semiconductor body having a body contact region and an abutting switching region;

forming trench isolation about the entire perimeter of said semiconductor body;

forming a bridged gate over said semiconductor body, said bridged gate having a bridge gate portion and an abutting gate portion, said bridge gate portion formed over a less than whole region of said body contact region and said gate portion formed over a channel region of said switching region, said bridge gate portion comprising a multilayer first gate stack comprising a gate dielectric layer on said semiconductor body and a first metal gate layer and said gate portion comprising a multilayer second gate stack comprising said gate dielectric layer on said semiconductor body and a second metal gate layer;

forming first and second source/drains in said switching region on opposite sides of said channel;

wherein a first work function difference between said bridge portion and said body contact region is different from a second work function difference between said gate portion and said channel region;

forming an upper body contact in said body contact region, a top surface of said upper body contact coplanar with a top surface of said semiconductor body, said upper body contact extending under said bridge gate portion and not extending to said insulating layer; and wherein said first gate metal layer and said second gate metal layer are the same layer and doped a same single dopant type.

12. The method of claim 11, wherein:

when said semiconductor device is an NFET, (i) said upper body contact region has a band gap that is narrower than a band gap of said semiconductor body or (ii) said upper body contact has an electron affinity that is lower than an electron affinity of said semiconductor body or (iii) said upper body contact region has a band gap that is narrower than a band gap of said semiconductor body and has an electron affinity that is lower than the electron affinity of said semiconductor body; and when said semiconductor device is a PFET, (iv) said upper body contact region has a band gap that is wider than a band gap of said semiconductor body or (v) said upper body contact has an electron affinity that is higher than an electron affinity of said semiconductor body or (vi) said upper body contact region has a band gap that is wider than a band gap of said semiconductor body and has an electron affinity that is higher than the electron affinity of said semiconductor body.

13. The method of claim 10, wherein:

when said semiconductor device is an NFET, said first metal gate layer of said bridge gate portion is a P-metal and said second metal gate layer of said gate portion is an N-metal; and when said semiconductor device is a PFET, said first metal gate layer of said bridge gate portion is an N-metal and said second metal gate layer of said gate portion is a P-metal.

14. A method, comprising:

providing a substrate comprising a semiconductor layer on an insulating layer, the semiconductor layer including a semiconductor body having a body contact region and an abutting switching region;

forming trench isolation about the entire perimeter of said semiconductor body;

forming a bridged gate over said semiconductor body, said bridged gate having a bridge gate portion and an abutting gate portion, said bridge gate portion formed over a less than whole region of said body contact region and said gate portion formed over a channel region of said switching region, said bridge gate portion comprising a multilayer first gate stack comprising a gate dielectric layer on said semiconductor body and a first metal gate layer and said gate portion comprising a multilayer second gate stack comprising said gate dielectric layer on said semiconductor body and a second metal gate layer;

forming first and second source/drains in said switching region on opposite sides of said channel;

wherein a first work function difference between said bridge portion and said body contact region is different from a second work function difference between said gate portion and said channel region;

wherein said first gate stack includes said gate dielectric layer, said first metal gate layer on a top surface of said gate dielectric layer;

wherein said second gate stack includes said gate dielectric layer, a tuning layer on a top surface of said gate dielectric layer, and said second metal gate layer on a top surface of and tuning layer; and wherein said first gate metal layer and said second gate metal layer are the same layer, said tuning layer comprising a different material then said first metal gate layer and said second metal gate layer, said tuning only under said gate portion of said bridged gate.

15. The method of claim 10, wherein:

when said semiconductor device is an NFET, said body contact region and said switching region are both doped P-type; and when said semiconductor device is a PFET, said body contact region and said switching region are both doped N-type.

16. The method of claim 10, wherein:

said bridged gate is in the form of a T, a longitudinal axis said gate portion of said bridged gate runs in a first direction and a longitudinal axis said bridge portion of said bridged gate runs in a second direction, said second direction perpendicular to said first direction.

17. The method of claim 10, wherein:

said trench isolation extends from a top surface of said semiconductor layer through said semiconductor layer to a top surface of said insulating layer; and a top surface of said trench isolation is coplanar with said top surface of said semiconductor layer.

18. The method of claim 10, further including:

forming a dielectric capping layer on top surfaces of said first and second metal gate layers.

19. The semiconductor device of claim 2, wherein:

when said semiconductor device is an NFET, said body contact region and said switching region are both doped P-type; and when said semiconductor device is a PFET, said body contact region and said switching region are both doped N-type.

20. The semiconductor device of claim 2, wherein:

said bridged gate is in the form of a T, a longitudinal axis said gate portion of said bridged gate runs in a first direction and a longitudinal axis said bridge portion of said bridged gate runs in a second direction, said second direction perpendicular to said first direction.

21. The semiconductor device of claim 2, wherein:

said trench isolation extends from a top surface of said semiconductor layer through said semiconductor layer to a top surface of said insulating layer; and a top surface of said trench isolation is coplanar with said top surface of said semiconductor layer.

22. The semiconductor device of claim 2, further including:

a same dielectric capping layer on top surfaces of said first and second metal gate layers.

23. The semiconductor device of claim 5, wherein:
when said semiconductor device is an NFET, said body contact region and said switching region are both doped P-type; and
when said semiconductor device is a PFET, said body contact region and said switching region are both doped N-type.

24. The semiconductor device of claim 5, wherein:
said bridged gate is in the form of a T, a longitudinal axis said gate portion of said bridged gate runs in a first direction and a longitudinal axis said bridge portion of said bridged gate runs in a second direction, said second direction perpendicular to said first direction.

25. The semiconductor device of claim 5, wherein:
said trench isolation extends from a top surface of said semiconductor layer through said semiconductor layer to a top surface of said insulating layer; and
a top surface of said trench isolation is coplanar with said top surface of said semiconductor layer.

26. The semiconductor device of claim 5, further including:
a same dielectric capping layer on top surfaces of said first and second metal gate layers.

27. The method of claim 10, wherein:
when said semiconductor device is an NFET, said body contact region and said switching region are both doped P-type; and
when said semiconductor device is a PFET, said body contact region and said switching region are both doped N-type.

28. The method of claim 11, wherein:
said bridged gate is in the form of a T, a longitudinal axis said gate portion of said bridged gate runs in a first direction and a longitudinal axis said bridge portion of said bridged gate runs in a second direction, said second direction perpendicular to said first direction.

29. The method of claim 11, wherein:
said trench isolation extends from a top surface of said semiconductor layer through said semiconductor layer to a top surface of said insulating layer; and
a top surface of said trench isolation is coplanar with said top surface of said semiconductor layer.

30. The method of claim 11, further including:
forming a dielectric capping layer on top surfaces of said first and second metal gate layers.

31. The method of claim 14, wherein:
when said semiconductor device is an NFET, said body contact region and said switching region are both doped P-type; and
when said semiconductor device is a PFET, said body contact region and said switching region are both doped N-type.

32. The method of claim 14, wherein:
said bridged gate is in the form of a T, a longitudinal axis said gate portion of said bridged gate runs in a first direction and a longitudinal axis said bridge portion of said bridged gate runs in a second direction, said second direction perpendicular to said first direction.

33. The method of claim 14, wherein:
said trench isolation extends from a top surface of said semiconductor layer through said semiconductor layer to a top surface of said insulating layer; and
a top surface of said trench isolation is coplanar with said top surface of said semiconductor layer.

34. The method of claim 14, further including:
forming a dielectric capping layer on top surfaces of said first and second metal gate layers.

* * * * *